(12) United States Patent
van Raalten et al.

(10) Patent No.: US 11,767,220 B2
(45) Date of Patent: Sep. 26, 2023

(54) COMPOSITIONS FOR USE IN ELECTROMAGNETIC INTERFERENCE SHIELDING

(71) Applicant: CarbonX IP 7 B.V., Amsterdam (NL)

(72) Inventors: Rutger Alexander David van Raalten, Amsterdam (NL); Daniela Sordi, Amsterdam (NL); Laure Aude Marie Suzanne Hannebicque, Amsterdam (NL); Zhen Liu, Amsterdam (NL)

(73) Assignee: CarbonX IP 7 B.V., Amsterdam (NL)

( * ) Notice: Subject to any disclaimer, the term of this patent is extended or adjusted under 35 U.S.C. 154(b) by 0 days.

(21) Appl. No.: 17/779,148

(22) PCT Filed: Nov. 27, 2020

(86) PCT No.: PCT/EP2020/083688
§ 371 (c)(1),
(2) Date: May 24, 2022

(87) PCT Pub. No.: WO2021/105395
PCT Pub. Date: Jun. 3, 2021

(65) Prior Publication Data
US 2023/0145289 A1   May 11, 2023

(30) Foreign Application Priority Data
Nov. 28, 2019  (EP) ...................... 19212349

(51) Int. Cl.
*C01B 32/158* (2017.01)
*C08K 3/04* (2006.01)
*H05K 9/00* (2006.01)

(52) U.S. Cl.
CPC .............. *C01B 32/158* (2017.08); *C08K 3/046* (2017.05); *H05K 9/009* (2013.01); *C01B 2202/22* (2013.01); *C01B 2202/36* (2013.01); *C01P 2004/13* (2013.01); *C01P 2006/60* (2013.01); *C08K 2201/001* (2013.01); *C08K 2201/011* (2013.01)

(58) Field of Classification Search
CPC .................. C01B 32/158-162; C08K 3/046; H05K 9/00-0098
See application file for complete search history.

(56) References Cited

U.S. PATENT DOCUMENTS

| | | | | |
|---|---|---|---|---|
| 2009/0135042 | A1* | 5/2009 | Umishita et al. | C01B 32/05 342/1 |
| 2009/0155578 | A1* | 6/2009 | Zhamu et al. | B82Y 30/00 423/447.2 |

(Continued)

FOREIGN PATENT DOCUMENTS

| | | |
|---|---|---|
| CN | 109881229 A | 6/2019 |
| WO | 2018002137 A1* | 1/2018 |

(Continued)

OTHER PUBLICATIONS

Hong et al.: "Carbon nanofiber mats for electromagnetic interference shielding", Carbon, Elsevier, Oxford, GB, vol. III, Oct. 14, 2016, pages 529-537, XP029808456, ISSN: 0008-6223, DOI: 10.1016/J.Carbon.2016.10.031 .

*Primary Examiner* — Matthew E. Hoban
(74) *Attorney, Agent, or Firm* — N.V. Nederlandsch Octrooibureau

(57) ABSTRACT

The invention pertains to the use of porous, chemically interconnected, isotropic carbon-nanofibre-comprising carbon networks for electromagnetic interference shielding (EMI). The invention also relates to a A composite assembly comprising a thermoplastic, elastomeric and/or thermoset polymer matrix and at least 15 wt%, preferably at least 20 wt%, more preferably 20 - 80 wt% of porous, chemically interconnected, crystalline carbon-nanofibres comprising carbon networks based on the total assembly weight.

20 Claims, 2 Drawing Sheets

(56) References Cited

U.S. PATENT DOCUMENTS

| | | | |
|---|---|---|---|
| 2010/0311866 A1 | 12/2010 | Huang et al. | |
| 2014/0151111 A1* | 6/2014 | Shah et al. | H05K 9/009 427/457 |
| 2016/0009934 A1* | 1/2016 | Han et al. | C09K 5/14 544/320 |

FOREIGN PATENT DOCUMENTS

WO 2019224397 A1 11/2019

* cited by examiner

COMPOSITIONS FOR USE IN ELECTROMAGNETIC INTERFERENCE SHIELDING

FIELD OF THE INVENTION

The invention is in the field of electromagnetic interference shielding (EMI).

BACKGROUND TO THE INVENTION

EMI is encountered by all of us in our daily life and the growing demands for instance of wireless devices which needs to communicate in the cloud (IoT, Electrical Vehicles, autonomous cars) brings the need for electro-magnetic shielding. Electromagnetic shielding is defined as the process of lowering the electromagnetic field by using electrically conductive or magnetic materials which act as shields. In the old days, EMI sensitivity was not of particular concern to the electronics industry as electronics devices typically were housed in metallic housings which functioned also to shield electronic devices from electromagnetic interference. Following the trend of miniaturization, plastics have since replaced metals making use of improved formability and increase complexity. However, conductive fillers are needed to provide the required electromagnetic shielding. Besides a shift towards plastics, another challenge appears at the horizon. The signal strength of devices (i.e. 5G) has increased resulting in a shift towards higher frequencies of electromagnetic shielding, making currently used shielding materials insufficient. Electromagnetic interference (EMI) can disrupt electronic devices, equipment, and systems that are used in critical applications (defence, automotive, aerospace), leading to drastic failure, damage beyond repair and moreover, can be harmful to human and animal life.

EMI shielding can be achieved by prevention of EM waves passing through an electric system either by reflection or by absorption of the incident radiation power. In order to achieve this shielding effect metals are conveniently used. Among those, galvanized steel and aluminium are the most widely used. Copper, nickel, pre-tin plated steel, zinc and silver are also applied for some purposes. However, as todays electronic devices become faster, smaller and lighter, metals are disadvantageous in weight consideration and pose a barrier for complex shapes. Moreover, the EM pollution is not truly eliminated or mitigated since the EM signals are almost completely reflected at the surface of the metal protecting the environment only beyond the shield. Hence, intensive research efforts have been focused on the development of EMI shielding materials that work by tuneable reflection and absorption based on novel materials that possess lightness, corrosion resistance, flexibility, easy processing, etc such as polymeric composites. EMI shielding composites can be based on different matrices such as: thermoplastic (e.g. PC/ABS, PA6, PP etc.), elastomers (FKM, SBR, NR, EPDM etc..), and thermosets (epoxy, polyesters, etc.). The fillers used to bring EMI shielding properties are metal coated materials such as Ni coated graphite, Ag coated graphite, Au coated graphite, stainless steel, carbon fibres.

Often these fillers are embedded in some graphene matrix. As an example, reference is made to EP230303, from 1987, disclosing an aqueous based electrically conductive paint having substantially enhanced settling properties employing a nickel plate pigment and a surfactant having substantial unsaturation characteristics.

EP3536665 is an example of such EMI materials, where thermal-conductivity graphene films are produced having an electromagnetic shielding effectiveness of 60 - 90 dB under the electromagnetic frequency of 30 MHz to 3 GHz. In CN109881229 carbon nanotubes (CNTs) which have been coated with metal particles.

The use of these conventional fillers come with many manufacturing issues such as viscosity rise, orientation etc. Reference is made to Valino et al. "Advances in 3D printing of thermoplastic polymer composites and nanocomposites" Prog. Polymer Sci. 98 (November 2019).

Importantly, there are mechanical restrictions to the amount of fillers that can be added. These loading restrictions have an impact on the limited shielding effectiveness that can be achieved using conventional fillers. Also, orientation of the fillers in the polymeric matrix leads to disadvantageous inconsistencies in shielding effectiveness. Moreover, fillers with an aspect ratio are keen to break upon applying high shear bringing again reliability issue in the product forming step. There is a continuous search for improvements in this field.

SUMMARY TO THE INVENTION

The inventors have found that recently developed carbon-nanofibre-comprising carbon networks can be beneficially be used for the purpose of electromagnetic interference (EMI) shielding. Those networks have not been advocated for such use. Said carbon-nanofibres-comprising carbon networks (i.e. carbon networks comprising carbon nanofibres) are porous, chemically interconnected, carbon-nanofibres-comprising carbon networks. In terms of shielding effectiveness in the window of 10 MHz - 40 GHz, excellent results are obtained and evidenced in the experimental parts herein. Also, composites comprising these networks do not show any disadvantageous orientation issues and the shielding is invariant to the manufacturing conditions such as processing pressure. The networks could be incorporated in large amounts even readily beyond 50 wt% of the composite without causing any (viscosity-associated) processing issues. With that, the use of these networks brings many advantages over fillers conventionally used for the purpose of electromagnetic shielding, and these benefits are not only in terms of ease of manufacturing; above all, increased loadings can be achieved. Again, reference is made to the examples. These networks achieve excellent EMI shielding while at the same time not making any compromises on tensile strength, stiffness, electrical properties and processability.

As detailed below, the carbon networks of the invention are preferably characterized in that they form an intraparticle porous network wherein the carbon nanofibers are interconnected to other carbon nanofibers in the network by chemical bonds via junctions, wherein the pores in the network have an intraparticle pore diameter size of 5-150 nm using Mercury Intrusion Porosimetry according to ASTM D4404-10, wherein at least 20 wt% of the carbon in the carbon networks is in crystalline form, and the carbon nanofibers have an average aspect ratio of fibre length-to-thickness of at least 2.

'Electromagnetic shielding' is the practice of reducing the electromagnetic field in a space by blocking the field with a barrier made of conductive or magnetic materials. With 'shielding effectiveness' or SE it is understood the ratio of the magnitude of the incident electric field to the magnitude of the transmitted electric field. Composites with at least 30 wt% of the networks of the present invention exhibit SE values of 20 - 100 dB in the frequency of 10 MHz -

40 GHz as measured according to IEEE299, wherein the SE value within the range actually depends on the amounts of networks incorporated in the polymeric matrix, and the thickness of the composite protective layer.

The invention thus relates to the use of porous, chemically interconnected, carbon-nanofibres comprising carbon network for electromagnetic interference shielding (EMI).

CLAUSES OF THE INVENTION

Figure 1A:
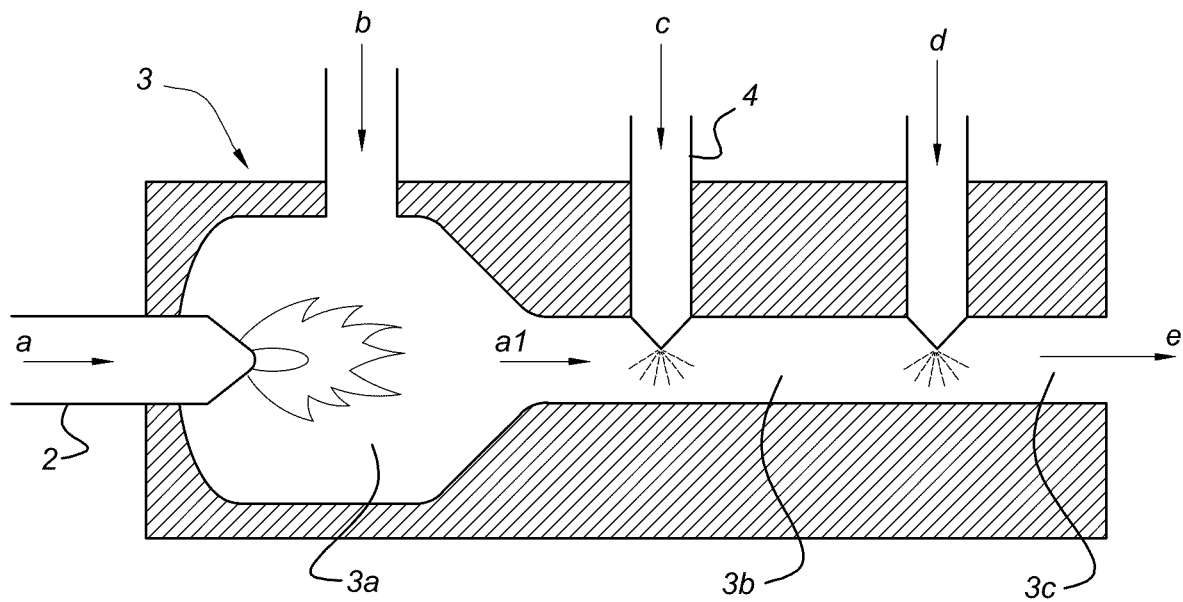
FIG. 1A is a schematic diagram of a continuous furnace carbon black producing process in accordance with the present invention which contains, along the axis of the reactor 3, a combustion zone 3a, a reaction zone 3b and a termination zone 3c, by producing a stream of hot waste gas a1 in the combustion zone by burning a fuel a in an oxygen-containing gas b and passing the waste gas a1 from the combustion zone 3a into the reaction zone 3b, spraying (atomizing) a single-phase emulsion c in the reaction zone 3b containing the hot waste gas, carbonizing said emulsion at increased temperature, and quenching or stopping the reaction in the termination zone 3c by spraying in water d, to obtain crystalline carbon networks e according to the invention.
Figure 1B:
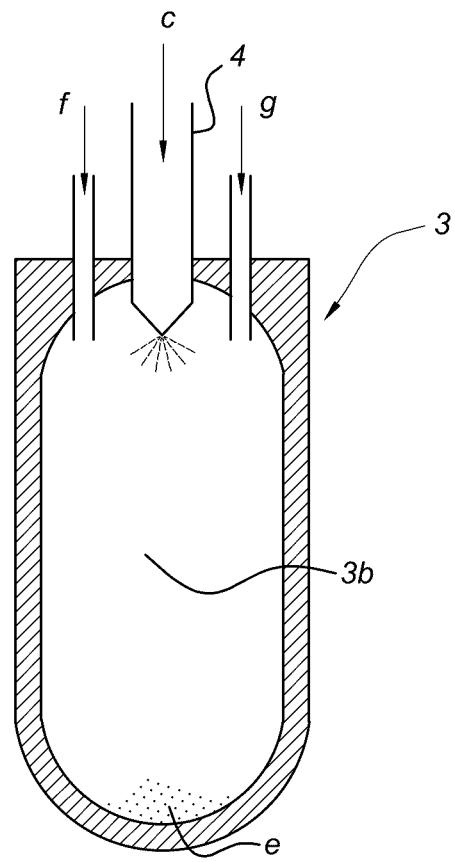
FIG. 1B is a schematic diagram of a semi-batch carbon black producing process where a single-phase emulsion c is atomized through a nozzle 4 at the top of the reactor 3 into the reactor zone 3b at elevated temperatures, carbonizing said emulsion at the elevated temperature in the reactor zone 3b, and collecting the crystalline carbon networks e at the bottom of the reactor. Additionally, two gas-inlets are present that enter the reactor from the top, for adding inert gas f, preferably nitrogen for controlling and/or depletion of oxygen-levels, and for introducing a carbon-containing gas g into the reactor, preferably acetylene or ethylene.

1. Use of porous, chemically interconnected, crystalline carbon-nanofibres comprising carbon networks for electromagnetic interference (EMI) shielding.
2. Use according to clause 1, for EMI shielding in the frequency of 10 MHz - 40 GHz.
3. Use according to clause 1 or 2, wherein the networks are incorporated in a thermoplastic, elastomeric and/or thermoset polymer matrix in an EMI shielding assembly, to obtain an assembly having a shielding effectiveness of at least 20 dB, preferably 20 - 100 dB, more preferably 30 - 100 dB, more preferably 40 - 100 dB, even more preferably 40 - 80 dB at frequencies between 10 MHz and 40 GHz according to IEEE299 on the outer surface of the assembly.
4. Use according to clause 3, wherein the assembly comprises at least 15 wt%, preferably at least 20 wt%, more preferably 20 - 80 wt% of porous, chemically interconnected, crystalline carbon-nanofibres comprising carbon networks based on the total assembly weight.
5. Use according to clause 3, wherein the assembly comprises porous, chemically interconnected, crystalline carbon-nanofibres comprising carbon networks together with one or more EMI shielding agents selected from carbon nanotubes (CNT), carbon fibres (CF), glass fibres (GF), steel fibres (SF) and porous, chemically interconnected, crystalline carbon-nanofibres comprising carbon networks, wherein at least 15 wt%, more preferably at least 20 wt%, preferably 30 - 80 wt% of the sum of all shielding agent(s), the number based on the weight of the assembly, and wherein the amount of porous, chemically interconnected, crystalline carbon-nanofibres comprising carbon networks is at least 1 wt%, more preferably at least 5 wt%, more preferably at least 10 wt%, most preferably 10 - 50 wt% of the assembly.
6. Use according to any one of clause 3 - 5, wherein the assembly is a housing assembly for an electric vehicle, a seal for an electrical vehicle, a battery casing for an energy source, radar shield or medical diagnostic shield.
7. Use according to any one of clauses 3 - 6, wherein the assembly has a volume resistivity of 0.01 -1000 ohm.cm, preferably 0.1 - 500 ohm.cm.
8. Use according to any one of clauses 3 - 7, wherein the tensile strength of the assembly is maintained or improved, preferably at a tensile strength value of 100 - 200% compared to the tensile strength of the corresponding assembly without the networks, preferably at a tensile strength value of at least 105%, more preferably at least 120%, -100%, most preferably 120%-170% of the tensile strength of the corresponding assembly without the networks.
9. Use according to any one of clauses 3 - 8, wherein the assembly has a stiffness which is 10%-300% higher, preferably 50 - 200% higherthan the stiffness for the corresponding assembly without the networks.
10. A composite assembly comprising a thermoplastic, elastomeric and/or thermoset polymer matrix and at least 15 wt%, preferably at least 20 wt%, more preferably 20 - 80 wt% of porous, chemically interconnected, crystalline carbon-nanofibres comprising carbon networks based on the total assembly weight.
11. A composite assembly comprising a thermoplastic, elastomeric and/or thermoset polymer matrix and one or more EMI shielding agents selected from carbon nanotubes (CNT), carbon fibres (CF), glass fibres (GF), steel fibres (SF) and porous, chemically interconnected, crystalline carbon-nanofibres comprising carbon networks, wherein at least 15 wt%, more preferably at least 20 wt%, preferably 30 - 80 wt% of the sum of all shielding agent(s), the number based on the weight of the assembly, and wherein the amount of porous, chemically interconnected, crystalline carbon-nanofibres comprising carbon networks is at least 1 wt%, more preferably at least 5 wt%, more preferably at least 10 wt%, most preferably 10 - 50 wt% of the assembly.
12. The assembly according to clause 10 or 11, having an electromagnetic shielding effectiveness of at least 20 dB, preferably 20 - 100 dB, more preferably 30 - 100 dB, more preferably 40 - 100 dB, even more preferably 40 - 80 dB at frequencies between 10 MHz and 40 GHz according to IEEE299 on the outer surface of the assembly.
13. The assembly according to any one of clauses 10 - 12, having a volume resistivity of 0.01 - 1000 ohm.cm, preferably 0.1 - 500 ohm/cm.
14. The assembly according to any one of clauses 10 - 13 wherein the assembly is a housing assembly for an electric vehicle, a seal for an electrical vehicle, a battery casing for an energy source, radar shield, medical diagnostic shield.
15. The assembly according to any one of clauses 10 - 14, wherein the tensile strength is maintained or improved, preferably at a tensile strength value of 100 - 200 % compared to the tensile strength of the corresponding assembly without the networks, preferably at a tensile strength value of at least 105%, more preferably at least 120%, -100%, most preferably 120%-170% of the tensile strength of the corresponding assembly without the networks.
16. The assembly according to any one of clauses 10 - 15, wherein the assembly has a stiffness which is 10%-300% higher, preferably 50 - 200% higher than the stiffness for the corresponding assembly without the networks.
17. Use or assembly according to any one of the preceding clauses, wherein the networks are obtainable by a process for the production of crystalline carbon networks in a reactor 3 which contains a reaction zone 3b and a termination zone 3c, by injecting a water-in-oil or bicontinuous micro-emulsion c, preferably a bicontinuous micro-emulsion c, said micro-emulsion comprising metal catalyst nanoparticles, into the reaction zone 3b which is at a temperature of above 600° C., preferably above 700° C., more preferably above 900° C., even more preferably above 1000° C., more preferably above 1100° C., preferably up to 3000° C., more preferably up to 2500° C., most preferably up to 2000° C., to produce crystalline carbon networks e, transferring these networks e to the termination zone 3c, and quenching or stopping the formation of crystalline carbon networks e in the termination zone by spraying in water d.
18. Use or assembly according to clause 17, wherein the reactor is a furnace carbon black reactor 3 which contains, along the axis of the reactor 3, a combustion zone 3a, a reaction zone 3b and a termination zone 3c, wherein the process for the production of crystalline carbon networks involves producing a stream of hot waste gas a1 in the combustion zone by burning a fuel a in an oxygen-containing gas b and passing the waste gas a1 from the combustion zone 3a into the reaction zone 3b, spraying a water-in-oil or bicontinuous micro-emulsion c, preferably a bicontinuous micro-emulsion c, said micro-emulsion comprising metal catalyst nanoparticles, in the reaction zone 3b containing the hot waste gas, carbonizing said emulsion at a temperature of above 600° C., preferably above 700° C., more preferably above 900° C., even more preferably above 1000° C., more preferably above 1100° C., preferably up to 3000° C., more preferably up to 2500° C., most preferably up to 2000° C., and quenching or stopping the reaction in the termination zone 3c by spraying in water d, to yield crystalline carbon networks e.
19. Use or assembly according to any one of the preceding clauses, wherein the networks have a crystal stacking height of 15 - 100 Å.
20. Use or assembly according to any one of the preceding clauses, wherein the networks have an intraparticle pore diameter size as measured using Mercury Intrusion Porosimetry (ASTM D4404-10) of 5 - 200 nm, preferably 10 - 150 nm, and most preferably of 20 - 130 nm.

DETAILED DESCRIPTION

The invention can be described as the use of porous, chemically interconnected, carbon-nanofibres comprising carbon networks for electromagnetic shielding, preferably in the frequency of 10 MHz - 40 GHz. The invention also relates to the use of these networks in polymer (thermoplastic, elastomer and/or thermoset) matrices for EMI applications (i.e. EMI shielding assemblies), preferably EMI shielding assemblies having a shielding effectiveness of at least 20 dB, preferably 20 - 100 dB, more preferably 30 - 100 dB, more preferably 40 - 100 dB, even more preferably 40 - 80 dB at frequencies between 10 MHz and 40 GHz according to IEEE299 on the outer surface of the assembly.

The invention also relates to composite assemblies comprising a polymeric matrix (thermoplastic, elastomer and/or thermoset) comprising at least 15 wt%, more preferably at least 20 wt%, preferably 30 - 80 wt% of porous, chemically interconnected, carbon-nanofibres comprising carbon networks based on the total assembly weight. The assembly of the composite with the (thermoplastic, elastomer and/or thermoset) carrier and the carbon network filler has an electromagnetic shielding effectiveness of at least 20 dB, preferably 20 - 100 dB, more preferably 30 - 100 dB, more preferably 40 - 100 dB, even more preferably 40 - 80 dB at frequencies between 10 MHz and 40 GHz according to IEEE299 on the outer surface of the assembly.

In one embodiment, the carbon networks are added together with one or more traditional EMI shielding agents, yielding at least 15 wt%, more preferably at least 20 wt%, preferably 30 - 80 wt% of the sum of all shielding agent(s), preferably shielding agent(s) selected from carbon nanotube (CNT), carbon fibres (CF), steel fibre and glass fibre (GF), the number based on the weight of the assembly. The amount of carbon networks in such embodiment can be economically reduced to at least 1 wt%, preferably at least 5 wt%, more preferably at least 10 wt%, most preferably 10 - 50 wt% of the assembly.

The EMI shielding assembly made from the polymeric matrix and incorporating substantive amounts of these carbon networks is preferably an assembly for the automotive industry, telephone carrier applications, defence application, sensing devices, and medical industry. In one embodiment, the composite assembly is for instance a housing assembly for an electric vehicle based on a thermoplastic polymer carrier (i.e. polymer matrix) shaped to form the covering lid. In another embodiment, the composite assembly is a seal for an electrical vehicle based on an elastomer carrier. In another embodiment, the assembly is a battery casing based on a thermoset carrier shaped to form a housing to contain an energy source.

The composite (assemblies) preferably have a volume resistivity of 0.01 - 1000 ohm.cm, preferably 0.1 - 500 ohm.cm.

In a preferred embodiment, the invention pertains to the use of these networks for EMI shielding in composites or composite assemblies as described here above, while maintaining or improving the tensile strength of the composite (assembly) tensile strength, preferably at a tensile strength value of 100 - 200% compared to the tensile strength of the neat matrix (i.e. the composite (assembly) without the networks), preferably a tensile strength value of at least 105%, more preferably at least 120%, most preferably 120%-170% of the tensile strength of the neat matrix according to ISO 527. In a preferred embodiment, the composite (assembly) has a stiffness which is 10%-300% higher than the stifness for the neat matrix, preferably 50-200% higher than the stiffness for the neat matrix according to the ISO 527.

The matrix in the composite can be any thermoplastic, elastomer and thermoset polymer, and even combinations thereof. The invention is not limited to the use of specific polymer matrices, but in fact is an improvement in terms of EMI and tensile strength properties of conventional EMI shielding assemblies using traditional polymers. Non-exhaustive examples of suitable polymers for forming thermoplastic polymeric layers are polypropylene (PP), polyethylene (PE), polyamide (PA), polyvinyl chloride (PVC), polycarbonate, polycarbonate/ ABS, acrylonitrile butadiene styrene (ABS), polytetrafluoroethylene (PTFE), ethylene tretrafluoroethylene (ETFE), polyethylene terephthalate (PET), polypropylene carbonate (PPC), cellulose triacetate (CTA), and polylactic acid (PLA). Examples of suitable polymers for forming elastomeric compounds are: natural rubber (NR), styrene butadiene rubber (SBR), EPDM, FKM, FFKM, NBR, ACM, HNBR, silicons. Examples of suitable thermoset polymers are: epoxy, polyesters, pDCPD, polyurethanes etc..

The inclusion level of the porous, chemically interconnected, crystalline, carbon-nanofibre-comprising carbon networks may suitable be at least 15 wt%, more preferably at least 20 wt%, more preferably between 30 and 80 wt.%, more preferably 35 - 75 wt%, even more preferably 40 - 70 wt.%, based on the weight of the composite. Here wt.% is defined in its usual meaning and refers to the percentage by mass or the mass fraction normalized to 100%. It is defined as the amount of the specific component (here carbon networks) divided by the sum of all components (here the composite material) and multiplied by 100%.

It is preferred that the composite (assembly) is substantially free from metal fillers, preferably comprising less than 1 wt%, even more preferably less than 0.5 wt%, most preferably less than 0.1 wt% of metal based on the total weight of the composite. The composite (assembly) thus avoids the disadvantages associated with conventional fillers and metal coatings in this field.

The skilled person will understand that a porous network refers to a 3-dimensional structure that allows fluids or gasses to pass through. A porous network may also be denoted as a porous medium or a porous material. The pore volume of the porous carbon networks according to the invention is 0.05- 5 cm³/g, preferably 0.1- 4 cm³/g, more preferably 0.5 - 3.5 cm³/g and most preferably 0.9 - 3 cm³/g as measured using Mercury Intrusion Porosimetry (ASTM D4404-10).

The carbon-nanofibre-comprising carbon networks may have an intraparticle pore diameter size as measured using Mercury Intrusion Porosimetry (ASTM D4404-10) of 5 - 200 nm, preferably 10 - 150 nm, and most preferably of 20 - 130 nm. Following the same ASTM test method, the networks may have an interparticle pore diameter of 10 - 500 µm, more preferably 80 - 400 µm.

The carbon-nanofibre-comprising carbon networks may have an intraparticle volume as measured using Mercury Intrusion Porosimetry (ASTM D4404-10) of 0.10 - 2 cm³/g, preferably 0.5 - 1.5 cm³/g, and most preferably of 0.5 - 1.2 cm³/g.

A porous crystalline carbon network according to the invention (or a porous carbon network particle of the invention) can be seen as a big molecule, wherein the carbon atoms inherently are covalently interconnected. It is hereby understood that a porous carbon network particle is a particle with chemically interconnected (i.e. covalently bonded) fibres having intraparticle porosity, as opposed to interparticle porosity which refers to a porous network created by multiple molecules or particles and wherein the pores are formed by the space between physically aggregated particles or molecules. In the context of the current invention, intraparticle porosity may also be denoted as intramolecular porosity as the carbon network particle according to the invention can be seen as a big molecule, wherein the pores are embedded. Hence intraparticle porosity and intramolecular porosity have the same meaning in the current text and may be used interchangeably.

As the networks of the invention can be seen as one big molecule, there is no need to fuse particles or parts of the network together. Hence it is preferred that the porous, chemically interconnected, carbon-nanofibrecomprising carbon networks are non-fused, intraparticle porous, chemically interconnected, crystalline carbon-nanofibre-comprising carbon networks, having intraparticle porosity.

Without being bound to a theory, it is believed that the benefit of having a crystalline network with intraparticle porosity over a(n amorphous) network with interparticle porosity is that the first are more robust and more resilient against crushing and breaking when force is applied. Known reinforcing agents, such as carbon black, consist of aggregates or agglomerates of spherical particles that may form a 3-dimensional structure, where spheres are fused with amorphous connections with weaker porosity.. The interparticle pores are weaker due to the particle-particle interface and tend to collapse. Intraparticle pores are strong due to the covalently crystalline aligned bonded structure surrounding them and can withstand high forces and pressures without collapsing.

As addressed here above, known reinforcing agents, such as carbon black, consist of aggregates or agglomerates of spherical particles that may form a 3-dimensional structure, where spheres are fused with amorphous connection between the individual particles (not chemically 'interconnected'),. Summarizing, intraparticle porosity refers to the situation wherein the carbon atoms surrounding the pores are covalently connected in crystalline form, wherein interparticle porosity refers to pores residing between particles which are physically aggregated, agglomerated, or have amorphous connections As the network of the invention can be seen as one big molecule, there is no need to fuse particles or parts of the network together. Hence it is preferred that the porous network of chemically interconnected, carbon-nanofibres are non-fused, intraparticle porous, chemically interconnected, carbon-nanofibre-comprising carbon networks, having intraparticle porosity. In a preferred embodiment, the intraparticle pore volume may be characterized as described further below, e.g. in terms of Mercury Intrusion Porosimetry (ASTM D4404-10) or Nitrogen Absorption method (ISO 9277:10).

The skilled person will readily understand that the term chemically interconnected in porous, chemically interconnected, carbon-nanofibre-comprising carbon networks implies that the carbon-nanofibres are interconnected to other carbon-nanofibres by chemical bonds. It is also understood that a chemical bond is a synonym for a molecular or a covalent bond. Typically those places where the carbon-nanofibres are connected are denoted as junctions or junctions of fibres, which may thus be conveniently addressed as 'covalent junctions' These terms are used interchangeable in this text. In the carbon networks according to the invention, the junctions are formed by covalently connected carbon atoms. It furthermore follows that the length of a fibre is defined as the distance between junctions which are connected by fibrous carbon material.

At least part of the fibres in the carbon-nanofibre-comprising carbon networks of the invention are crystalline carbon-nanofibres. Preferably at least 20 wt.% of the carbon in the carbon networks in the invention is crystalline, more preferably at least 40 wt.%, even more preferably at least 60 wt.%, even more preferably at least 80 wt.% and most preferably at least 90 wt.%. Alternatively the amount of crystalline carbon is 20-90 wt.%, more preferably 30-70 wt.%, and more preferably 40-50 wt.% compared to the total carbon in the carbon networks of the invention.

Here 'crystalline' has its usual meaning and refers to a degree of structural order in a material. In other words the carbon atoms in the nanofibres are to some extent arranged in a regular, periodic manner. The areas or volumes which are crystalline can be denoted as crystallites. A carbon crystallite is hence an individual carbon crystal. A measure for the size of the carbon crystallites is the stacking height of graphitic layers. Standard ASTM grades of carbon black have a stacking height of the graphitic layers within these crystallites ranging from 11-13 Å (angstroms). The carbon-nanofibre-comprising carbon networks of the invention preferably have a stacking height of at least 15 Å (angstroms), preferably at least 16 Å, more preferably at least 17 Å, even more preferably at least 18 Å, even more preferably at least 19 Å and still more preferably at least 20 Å. If needed the carbon networks with crystallites as large as 100 Å (angstroms) can be produced. Hence the carbon networks of the invention have a stacking height of 15 - 100 Å (angstroms), more preferably of up to 80 Å, even more preferably of up to 60 Å, even more preferably of up to 40 Å, still more preferably of up to 30 Å. It is therefore understood that the stacking height of graphitic layers within crystallites in the carbon networks of the invention is 15-90 Å (angstroms), more preferably 16-70 Å, even more preferably 17-50 Å, still more preferably 18-30 Å and most preferably up to 25 Å.

The porous, chemically interconnected, carbon-nanofibre-comprising carbon networks may be defined as having chemically interconnected carbon-nanofibres, wherein carbon-nanofibres are interconnected via junction parts, wherein several (typically 3 or more, preferably at least 10 or more) nanofibres are covalently joined. Said carbon-nanofibres are those parts of the network between junctions. The fibres typically are elongated bodies which are solid (i.e. non-hollow), preferably having an average diameter or thickness of 1 - 500 nm, preferably of 5 - 350 nm, more preferably up to 100 nm, in one embodiment 10 - 100 nm, compared to the average particle size of 10 - 400 nm for carbon black particles. In one embodiment, the average fibre length (i.e. the average distance between two junctions) is preferably in the range of 10,000 nm, more preferably 50 - 5,000 nm, more preferably 100 - 5,000 nm, more preferably at least 200 - 5,000 nm, as for instance can be determined using SEM.

The nanofibres or structures may preferably be described in terms of an average aspect ratio of fibre length-to-thickness of at least 2, preferably at least 3, more preferably at least 4, and most preferably at least 5, preferably at most below 50; in sharp contrast with the amorphous (physically associated) aggregates formed from spherical particles obtained through conventional carbon black manufacturing.

The carbon-nanofibre structures may be defined as carbon networks formed by chemically interconnected (covalently bonded) carbon-nanofibres. Said carbon networks have a 3-dimensional configuration wherein there is an opening between the carbon-nanofibres (the intraparticle porosity, see above) that is accessible to a continuous phase, which may be a liquid - such as a solvent or an aqueous phase -, a gas or any other phase. Said carbon networks are at least 0.5 µm in diameter, preferably at least 1 µm in diameter, preferably at least 5 µm in diameter, more preferably at least 10 µm in diameter, even more preferably at least 20 µm in diameter and most preferably at least 25 µm in all dimensions. Alternatively said carbon networks are at least 1 µm in diameter in 2 dimensions and at least 5 µm in diameter, preferably at least 10 µm in diameter, more preferably a least 20 µm in diameter and most preferably at least 25 µm in diameter in the other dimension. Here, and also throughout this text, the term dimension is used in its normal manner and refers to a spatial dimension. There are 3 spatial dimensions which are orthogonal to each other and which define space in its normal physical meaning. It is furthermore possible that said carbon networks are at least 10 µm in diameter in 2 dimensions and at least 15 µm in diameter, preferably at least 20 µm in diameter, more preferably a least 25 µm in diameter, more preferably at least 30 µm in diameter and most preferably at least 50 µm in diameter in the other dimension. These measurements are based on laser diffraction.

The carbon-nanofibre-comprising carbon networks may have a volume-based aggregate size as measured using laser diffraction (ISO 13320-1) or dynamic light scattering analysis of 0.1 - 100 µm, preferably 1 - 50 µm, more preferably 1 - 40 µm, more preferably of 5 - 35 µm, more preferably of 5 - 25 µm and most preferably of 5 - 20 µm. The networks preferably have an advantageously narrow particle size distribution, particularly compared to traditional carbon black. The particle size distribution may be characterized between 10 and 200 nm, preferably 10 - 100 nm as determined using the transmission electronic microscope and measuring the diameter of the fibres.

The networks may be characterized by an aggregate strength between 0.5 and 1, more preferably between 0.6 and 1, as determined by the c-OAN/OAN ratio measured according to ASTM D3493-16/ASTM D2414-16 respectively. The c-OAN is preferably 20 - 200 cc/100 g.

This is an advantageously high strength which prevents collapse of the intraporosity even in highpressure applications.

The surface area of the carbon-nanofibre-comprising carbon networks as measured according to the Brunauer, Emmett and Teller (BET) method (ISO 9277:10) is preferably in the range of 15 - 300 m²/g, more preferably 20 - 270 m²/g, even more preferably 30 - 250 m²/g and most preferably 30 - 210 m²/g.

The porous, chemically interconnected, carbon-nanofibre-comprising carbon networks may also comprise carbon black particles built in as part of the network. These particles are profoundly found at the junctions between carbon-nanofibres, but there may also be carbon black particles present at other parts of the network. The carbon black particles preferably have a diameter of at least 0.5 times the diameter of the carbon-nanofibres, more preferably at least the same diameter of the carbon-nanofibres, even more preferably at least 2 times the diameter of the carbon-nanofibres, even more preferably at least 3 times the diameter of the carbon-nanofibres, still more preferably at least 4 times the diameter of the carbon-nanofibres and most preferably at least 5 times the diameter of the carbon-nanofibres. It is preferred that the diameter of the carbon black particles is at most 10 times the diameter of the carbon-nanofibres. Such mixed networks are denoted as hybrid networks.

The porous, chemically interconnected, carbon-nanofibre-comprising carbon networks have a functionalized surface. In other words, the surface comprises groups that alter the hydrophobic nature of the surface - which is typical for carbon - to a more hydrophilic nature. The surface of the carbon networks comprises carboxylic groups, hydroxylic groups and phenolics. These groups add some polarity to the surface and may change the properties of the compound material in which the functionalized carbon networks are embedded. Without wishing to be bound to a theory, it is believed that the functionalized groups bind to the elastomer, for instance by forming H-bonds, and therefore increase the resilience of the materials. Hence at least the stiffness and the durability of the material are altered which may result in lower rolling resistance and increased operational life span of the reinforced elastomer, in particular of tyres or conveyor belts comprising said reinforced elastomer.

The porous, chemically interconnected, carbon-nanofibre-comprising carbon networks comprise metal catalyst nanoparticles, but only in minute amounts, typically at least 10 ppm based on the weight of the carbon-nanofibre-comprising carbon networks. These are a fingerprint of the preparation method. There is preferred an amount of at most 5000 ppm, more preferably at most 3000 ppm, especially at most 2000 ppm of metal nanoparticles based on the weight of the networks measured by ICP-OES (Inductive Coupled Plasma- Optical Emission Spectrometry). These metal particles are also embedded in the networks, not to be compared to metal coats applied in the art. These particles may have an average particle size between 1 nm and 100 nm. Preferably said particles are monodisperse particles having deviations from their average particle size which are within 10 %, more preferably within 5%. Non-limiting examples of nanoparticles included in the carbon-nanofibre-comprising carbon networks are the noble metals (Pt, Pd, Au, Ag), iron-family elements (Fe, Co and Ni), Ru, and Cu. Suitable metal complexes may be (i) platinum precursors such as $H_2PtCl_6$; $H_2PtCl_6.xH_2O$; $K_2PtCl_4$; $K_2PtCl_4.xH_2O$; $Pt(NH_3)_4(NO_3)_2$; $Pt(C_5H_7O_2)_2$, (ii) ruthenium precursors such as $Ru(NO)(NO_3)_3$; $Ru(dip)_3Cl_2$ [dip = 4,7-diphenyl-1,10-fenanthroline]; $RuCl_3$, or (iii) palladium precursors such as $Pd(NO_3)_2$, or (iv) nickel precursors such as $NiCl_2$ or $NiCl_2.xH_2O$; $Ni(NO_3)_2$; $Ni(NO_3)_2.xH_2O$; $Ni(CH_3COO)_2$; $Ni(CH_3COO)_2.xH_2O$; $Ni(AOT)_2$ [AOT = bis(2-ethylhexyl) sulphosuccinate], wherein x may be any integer chosen from 1, 2, 3, 4, 5, 6, 7, 8, 9 or 10 and typically may be 6, 7 or 8.

The porous, chemically interconnected, carbon-nanofibre-comprising carbon networks are preferably obtainable by the process for the production of crystalline carbon networks in a reactor 3 which contains a reaction zone 3b and a termination zone 3c, by injecting a water-in-oil or bicontinuous micro-emulsion c, preferably a bicontinuous micro-emulsion c, said micro-emulsion comprising metal catalyst nanoparticles, into the reaction zone 3b which is at a temperature of above 600° C., preferably above 700° C., more preferably above 900° C., even more preferably above 1000° C., more preferably above 1100° C., preferably up to 3000° C., more preferably up to 2500° C., most preferably up to 2000° C., to produce crystalline carbon networks e, transferring these networks e to the termination zone 3c, and quenching or stopping the formation of crystalline carbon networks in the termination zone by spraying in water d.

In a more preferred embodiment, the networks are obtainable by the above process, said reactor being a furnace carbon black reactor 3 which contains, along the axis of the reactor 3, a combustion zone 3a, a reaction zone 3b and a termination zone 3c, by producing a stream of hot waste gas a1 in the combustion zone by burning a fuel a in an oxygen-containing gas b and passing the waste gas a1 from the combustion zone 3a into the reaction zone 3b, spraying a water-in-oil or bicontinuous micro-emulsion c, preferably a bicontinuous micro-emulsion c, said micro-emulsion comprising metal catalyst nanoparticles, in the reaction zone 3b containing the hot waste gas, carbonizing said emulsion at a temperature of above 600° C., preferably above 700° C., more preferably above 900° C., even more preferably above 1000° C., more preferably above 1100° C., preferably up to 3000° C., more preferably up to 2500° C., most preferably up to 2000° C., and quenching or stopping the reaction in the termination zone 3c by spraying in water d, to yield crystalline carbon networks e.

In the above, 'chemically interconnected' is understood to mean that the nanofibres are covalently bonded to one another, clearly distinct from physical aggregates.

The networks are preferably obtainable by the above process wherein further processing details are provided in the section headed "Process for obtaining carbon-nanofibre-comprising carbon networks" here below, and in FIG. 1A.

Process for Obtaining Carbon-Nanofibre-Comprising Carbon Networks

A process for obtaining the porous, chemically interconnected, carbon-nanofibre-comprising carbon networks as described here above can be described best as a modified carbon black manufacturing process, wherein 'modified' is understood that a suitable oil, preferably an oil comprising at least 14 C atoms (>C14) such as carbon black feedstock oil (CBFS), is provided to the reaction zone of a carbon black reactor as part of a single-phase emulsion, being a thermodynamically stable micro-emulsion, said micro-emulsion comprising metal catalyst nanoparticles. The thermodynamically stable micro-emulsion is a water-in-oil or bicontinuous micro-emulsion c, preferably a bicontinuous micro-emulsion, said micro-emulsion comprising metal catalyst nanoparticles. The preferred single-phase emulsion comprises CBFS oil, and may be referred to as 'emulsified CBFS' in the context of the invention. The water domains should contain a metal catalyst, preferably having an average particle size between 1 nm and 100 nm.

The emulsion is preferably provided to the reaction zone by spraying, thus atomizing the emulsion to droplets. While the process can be carried out batch or semi-batch wise, the modified carbon black manufacturing process is advantageously carried out as a continuous process.

The process for the production of the carbon networks can be performed in a reactor 3 which contains a reaction zone 3b and a termination zone 3c, by injecting a single-phase emulsion c, being a micro-emulsion comprising metal catalyst nanoparticles, preferably a CBFS-comprising emulsion, into the reaction zone 3b which is at a temperature of above 600° C., preferably above 700° C., more preferably above 900° C., even more preferably above 1000° C., more preferably above 1100° C., preferably up to 3000° C., more preferably up to 2500° C., most preferably up to 2000° C., to produce porous, chemically interconnected, carbon-nanofibre-comprising carbon networks, transferring these networks to the termination zone 3c, and quenching orstopping the formation of porous, chemically interconnected, carbon-nanofibre-comprising carbon networks in the termination zone by spraying in water d. The single-phase emulsion is preferably sprayed into the reaction zone. Reference is made to FIG. 1A.

Alternatively the process for the production of the porous, chemically interconnected, carbon-nanofibre-comprising carbon networks is performed in a furnace carbon black reactor 3 which contains, along the axis of the reactor 3, a combustion zone 3a, a reaction zone 3b and a termination zone 3c, by producing a stream of hot waste gas a1 in the combustion zone by burning a fuel a in an oxygen-containing gas b and passing the waste gas a1 from the combustion zone 3a into the reaction zone 3b, spraying (atomizing) a single-phase emulsion c according to the invention, preferably the micro-emulsion comprising metal catalyst nanoparticles as described here above, preferably a CBFS-comprising w/o or bicontinuous micro-emulsion, preferably a bicontinuous micro-emulsion, in the reaction zone 3b containing the hot waste gas, carbonizing said emulsion at increased temperatures (at a temperature of above 600° C., preferably above 700° C., more preferably above 900° C., even more preferably above 1000° C., more preferably above 1100° C., preferably up to 3000° C., more preferably up to 2500° C., most preferably up to 2000° C.), and quenching or stopping the reaction (i.e. the formation of porous, chemically interconnected, carbon-nanofibre-comprising carbon networks) in the termination zone 3c by spraying in water d. The reaction zone 3b comprises at least one inlet (preferably a nozzle) for introducing the emulsion, preferably by atomization. Reference is made to FIG. 1A.

Residence times for the emulsion in the reaction zone of the furnace carbon black reactor can be relatively short, preferably ranging from 1 - 1000 ms, more preferably 10 - 1000 ms. Longer residence times may have an effect on the properties of the carbon networks. An example may be the size of crystallites which is higher when longer residence times are used.

In accordance with conventional carbon black manufacturing processes, the oil phase can be aromatic and/or aliphatic, preferably comprising at least 50 wt.% C14 or higher, more preferably at least 70 wt.% C14 or higher (based on the total weight of the oil). List of typical oils which can be used, but not limited to obtain stable emulsions are carbon black feedstock oils (CBFS), phenolic oil, anthracene oils, (short-medium-long chain) fatty acids, fatty acids esters and paraffins. The oil is preferably a C14 or higher. In one embodiment, the oil preferably has high aromaticity. Within the field, the aromaticity is preferably characterized in terms of the Bureau of Mines Correlation Index (BMCI). The oil preferably has a BMCI > 50. In one embodiment, the oil is low in aromaticity, preferably having a BMCI < 15.

CBFS is an economically attractive oil source in the context of the invention, and is preferably a heavy hydrocarbon mix comprising predominantly C14 to C50, the sum of C14 - C50 preferably amounting to at least 50 wt.%, more preferably at least 70 wt.% of the feedstock. Some of the most important feedstocks used for producing carbon black include clarified slurry oil (CSO) obtained from fluid catalytic cracking of gas oils, ethylene cracker residue from naphtha steam cracking and coal tar oils. The presence of paraffins (<C15) substantially reduces their suitability, and a higher aromaticity is preferred. The concentration of aromatics determines the rate at which carbon nuclei are formed. The carbon black feedstock preferably has a high BMCI to be able to offer a high yield with minimum heat input hence reducing the cost of manufacturing. In a preferred embodiment, and in accordance with current CBFS specifications, the oil, including mixtures of oil, has a BMCI value of more than 120. While the skilled person has no difficulties understanding which are suitable CBFS, merely as a guide it is noted that - from a yield perspective - a BMCI value for CBFS is preferably more than 120, even more preferably more than 132. The amount of asphaltene in the oil is preferably lower than 10 wt.%, preferably lower than 5.0 wt.% of the CBFS weight. The CBFS preferably has low sulphur content, as sulphur adversely affects the product quality, leads to lower yield and corrodes the equipment.

It is preferred that the sulphur content of the oil according to ASTM D1619 is less than 8.0 wt.%, preferably below 4.0 wt.% more preferably less than 2.0 wt.%.

Provided that a stable, single-phase w/o or bicontinuous micro-emulsion is obtained, the amounts of water and oil are not regarded limiting, but it is noted that reduced amounts of water (and increased amounts of oil) improve yields. The water content is typically between 5 and 50 wt% of the emulsion, preferably 10-40 wt%, even more preferably up to 30 wt%, more preferably 10 - 20 wt% of the emulsion. While higher amounts of water can be considered, it will be at the cost of yield. Without wishing to be bound by any theory, the inventors believe that the water phase attributes to the shape and morphology of the networks thus obtained.

The choice of surfactant(s) is not regarded a limiting factor, provided that the combination of the oil, water and surfactant(s) results in a stable micro-emulsion as defined here above. As further guidance to the skilled person, it is noted that the surfactant can be selected on the basis of the hydrophobicity or hydrophilicity of the system, i.e. the hydrophilic-lipophilic balance (HLB). The HLB of a surfactant is a measure of the degree to which it is hydrophilic or lipophilic, determined by calculating values for the different regions of the molecule, according to the Griffin or Davies method. The appropriate HLB value depends on the type of oil and the amount of oil and water in the emulsion, and can be readily determined by the skilled person on the basis of the requirements of retaining a thermodynamically stable, single-phase emulsion as defined above. It is found that an emulsion comprising more than 50 wt% oil, preferably having less than 30 wt% water phase, would be stabilized best with a surfactant having an HLB value above 7, preferably above 8, more preferably above 9, most preferably above 10. On the other hand, an emulsion with at most 50 wt% oil would be stabilized best with a surfactant having an HLB value below 12, preferably below 11, more preferably below 10, most preferably below 9, particularly below 8. The surfactant is preferably selected to be compatible with the oil phase. In case the oil is a CBFS-comprising emulsion with a CBFS, a surfactant with high aromaticity is preferred, while an oil with low BMCI, such as characterized by BMCI < 15, would be stabilized best using aliphatic surfactants. The surfactant(s) can be cationic, anionic or non-ionic, or a mixture thereof. One or more non-ionic surfactants are preferred, in order to increase the yields since no residual ions will be left in the final product. In order to obtain a clean tail gas stream, the surfactant structure is preferably low in sulfur and nitrogen, preferably free from sulfur and nitrogen. Non-limiting examples of typical non-ionic surfactants which can be used to obtain stables emulsions are commercially available series of Tween, Span, Hypermer, Pluronic, Emulan, Neodol, Triton X and Tergitol.

The single-phase emulsion, i.e. a w/o or bicontinuous micro-emulsion, preferably a bicontinuous micro-emulsion, further comprises metal catalyst nanoparticles preferably having an average particle size between 1 and 100 nm. The skilled person will find ample guidance in the field of carbon nanotubes (CNTs) to produce and use these kinds of nanoparticles. These metal nanoparticles are found to improve network formation in terms of both rates and yields, and reproducibility. Methods for manufacturing suitable metal nanoparticles are found in Vinciguerra et al. "Growth mechanisms in chemical vapour deposited carbon nanotubes" Nanotechnology (2003) 14, 655; Perez-Cabero et al. "Growing mechanism of CNTs: a kinetic approach" J. Catal. (2004) 224, 197-205; Gavillet et al. "Microscopic mechanisms for the catalyst assisted growth of single-wall carbon nanotubes" Carbon. (2002) 40, 1649-1663 and Amelinckx et al. "A formation mechanism for catalytically grown helix-shaped graphite nanotubes" Science (1994) 265, 635-639, their contents about manufacturing metal nanoparticles herein incorporated by reference. These metal nanoparticles are embedded in the network.

The metal catalyst nanoparticles are used in the aforementioned bicontinuous or w/o microemulsion, preferably a CBFS-comprising bicontinuous or w/o micro-emulsion. In one embodiment, a bicontinous micro-emulsion is most preferred. Advantageously, the uniformity of the metal particles is controlled in said (bicontinuous) micro-emulsion by mixing a first (bicontinuous) micro-emulsion in which the aqueous phase contains a metal complex salt capable of being reduced to the ultimate metal particles, and a second (bicontinuous) micro-emulsion in which the aqueous phase contains a reductor capable of reducing said metal complex salt; upon mixing the metal complex is reduced, thus forming metal particles. The controlled (bicontinuous) emulsion environment stabilizes the particles against sintering or Ostwald ripening. Size, concentrations and durability of the catalyst particles are readily controlled. It is considered routine experimentation to tune the average metal particle size within the above range, for instance by amending the molar ratio of metal precursor vs. the reducing agent. An increase in the relative amount of reducing agent yields smaller particles. The metal particles thus obtained are monodisperse, deviations from the average metal particle size are preferably within 10%, more preferably within 5%. Also, the present technology provides no restraint on the actual metal precursor, provided it can be reduced. Non-limiting examples of nanoparticles included in the carbon-nanofibre-comprising carbon networks are the noble metals (Pt, Pd, Au, Ag), iron-family elements (Fe, Co and Ni), Ru, and Cu. Suitable metal complexes may be (i) platinum precursors such as $H_2PtCl_6$; $H_2PtCl_6 \cdot xH_2O$; $K_2PtCl_4$; $K_2PtCl_4 \cdot xH_2O$; $Pt(NH_3)_4(NO_3)_2$; $Pt(C_5H_7O_2)_2$, (ii) ruthenium precursors such as $Ru(NO)(NO_3)_3$; $Ru(dip)_3Cl_2$ [dip = 4,7-diphenyl-1, 10-fenanthroline]; $RuCl_3$, or (iii) palladium precursors such as $Pd(NO_3)_2$, or (iv) nickel precursors such as $NiCl_2$ or $NiCl_2 \cdot xH_2O$; $Ni(NO_3)_2$; $Ni(NO_3)_2 \cdot xH_2O$; $Ni(CH_3COO)_2$; $Ni(CH_3COO)_2 \cdot xH_2O$; $Ni(AOT)_2$ [AOT = bis(2-ethylhexyl)sulphosuccinate], wherein x may be any integer chosen from 1, 2, 3, 4, 5, 6, 7, 8, 9 or 10 and typically is 6, 7 or 8. Non-limiting suitable reducing agents are hydrogen gas, sodium boron hydride, sodium bisulphate, hydrazine or hydrazine hydrate, ethylene glycol, methanol and ethanol. Also suited are citric acid and dodecylamine. The type of metal precursor is not an essential part of the invention. The metal of the particles of the (bicontinuous) micro-emulsion are preferably selected from the group consisting of Pt, Pd, Au, Ag, Fe, Co, Ni, Ru and Cu, and mixtures thereof, in order to control morphology of the carbon structures networks ultimately formed. The metal nanoparticles end up embedded inside these structures where the metal particles are physically attached to the structures. While there is no minimum concentration of metal particles at which these networks are formed - in fact networks are formed using the modified carbon black manufacturing process according to the invention - it was found that the yields increase with the metal particle concentrations. In a preferred embodiment, the active metal concentration is at least 1 mM, preferably at least 5 mM, preferably at least 10 mM, more preferably at least 15 mM, more preferably at least 20 mM, particularly at least 25 mM, most preferably up to 3.5 M, preferably up to 3 M. In one embodiment, the metal nanoparticles comprise up to 250 mM. These are concentrations of the catalyst relative to the amount of the aquueous phase of the (bicontinuous) micro-emulsion.

Atomization of the single-phase emulsion, preferably a CBFS-comprising emulsion, is preferably realized by spraying, using a nozzle-system 4, which allows the emulsion droplets to come in contact with the hot waste gas $a1$ in the reaction zone 3b, resulting in traditional carbonization, network formation and subsequent agglomeration, to produce carbon networks according to the invention. The injection step preferably involves increased temperatures above 600° C., preferably between 700 and 3000° C., more preferably between 900 and 2500° C., more preferably between 1100 and 2000° C.

Compared to traditional carbon black, the porous, chemically interconnected, carbon-nanofibre-comprising carbon networks according to the invention may be characterized in terms of one or more, preferably at least two, most preferably all of (i) a relatively narrow particle size distribution, (ii) an increased aggregate strength and (iii) an increased and aligned crystallinity (i.e. larger crystal size or stacking height) as defined here above.

In one aspect, the porous, chemically interconnected, carbon-nanofibre-comprising carbon networks preferably have at least one, preferably at least two, more preferably at least three, most preferably all of the following properties:
(i) Iodine Adsorption Number (IAN) of 10 - 1000 mg/g at least 30 mg/g, preferably between 100 and 800 mg/g, even more preferably between 20-500 mg/g according to ASTM D1510;
(ii) Nitrogen Surface Area (N2SA) of at least 15 m²/g, preferably 15 - 1000 m²/g, more preferably 20 - 500 m²/g, according to ASTM D6556 and ISO 9277:10;
(iii) Statistical Thickness Surface Area (STSA) of at least 5 m²/g, more preferably 20 - 500 m²/g, even more preferably 20 - 300 m²/g, according to ASTM D6556;
(iv) Oil Absorption Number (OAN) of 20-200 cc/100 g, preferably 40 - 150 cc/100 g according to ASTM D2414, wherein:
IAN = Iodine Adsorption Number: the number of grams of iodine adsorbed per kilogram of carbon black under specified conditions as defined in ASTM D1510;
N2SA = nitrogen surface area: the total surface area of carbon black that is calculated from nitrogen adsorption data using the B.E.T. theory, according to ASTM D6556;
STSA = statistical thickness surface area: the external surface area of carbon black that is calculated from nitrogen adsorption data using the de Boer theory and a carbon black model, according to ASTM D6556; and
OAN = Oil Absorption Number: the number of cubic centimeters of dibutyl phthalate (DBP) or paraffin oil absorbed by 100 g of carbon black under specified conditions. The OAN value is proportional to the degree of aggregation of structure level of the carbon black, determined according to ASTM D2414.

For each of IAN, N2SA (or NSA), STSA and OAN - all typical parameters for characterizing carbon black materials - the porous, chemically interconnected, carbon-nanofibre-comprising carbon networks exhibit superior properties compared to traditional carbon black. The porous, chemically interconnected, carbon-nanofibre-comprising carbon networks are preferably characterized by at least one, preferably at least two, more preferably all of (i), (ii) and (iii)

since these are typical ways of characterized the surface area properties of the materials. In one embodiment, the porous, chemically interconnected, carbon-nanofibre-comprising carbon networks exhibit at least one of (i), (ii) and (iii), and further comply with (iv).

EXAMPLES

Example 1: Composite Made of Carbon Networks and a Polymer Matrix, Including Shielding Effectiveness (SE) Performance Measurements in the Frequency Domain of 10 MHz to 14 GHz Two different grades of carbon networks (XR-1 and X7-P) were prepared according to the manufacturing process - including recipe - of example 1 in WO2018/002137, its contents herein incorporated by reference. The XR1 grade was obtained using a tread-reactor and the X7-P grade was obtained using a carcass reactor. Both are common reactors in the field of carbon black manufacturing. The variation in the manufacturing process can be attributed to the different reactor used carcass (longer residence times) and tread (shorter residence times) as shown below.

| Grade | Residence time* |
|---|---|
| XR-1 | ~250 ms |
| X7-P | 414-816 ms |

*Theoretical model

These grades were characterized below:

| Sample ID | | | X7-P | XR-1 |
|---|---|---|---|---|
| OAN | ASTM D2414 | cc/100 g | 75 | 70 |
| c-OAN | ASTM D3493 | cc/100 g | 67 | 70 |
| IAN | ASTM D1510 | g/kg | 45 | 203 |
| Total N2SA (BET) | ASTM D6556 | m²/g | 40.5 | 189.4 |
| External STSA | | m²/g | 40.1 | 134.4 |
| Volume total pores | ASTM D 4404-10 | cm³/g | 0.95 | 1.58 |
| Volume intra particle pores | | cm³/g | 0.61 | 0.66 |
| diameter intraparticle pores | | μm | 0.07 | 0.02 |
| diameter interparticle pores | | μm | 250 | 125 |
| % porosity | | % | 64 | 73 |
| Fe | ICP-OES | ppm | 1248 | 1332 |
| % ash | ASTM D1506 | % | 0.30 | 0.60 |
| Sieve residues (45um) | ASTM D1514 | mg/kg | 88 | 310 |
| pH | ASTM 1512 | a.u. | 7.00 | 6.23 |
| Hardness of pellets | ASTM D5230 | cN | 31.7 | 31.6 |
| | | cN | 78.5 | 54.0 |
| | | cN | 12.5 | 14.0 |
| Pour density | Internal | g/ml | 0.51 | 0.47 |
| Structure diameter (average) | SEM | nm | 74.00 | 35.10 |
| | | St.dev. ± | 12.30 | 6.70 |
| Sum PAHs | AfPS GS 2014:01 PAK | ppm | 38.80 | 0.40 |

Particle size distribution XR-1: between 20 and 65 nm; X7-P: 20 - 115 nm.

These different grades were then incorporated in polyamide 6 (PA6; Akulon F2223D) by means of a twin screw extruder (L/D = 40, D = 26 mm).

The SE performance was tested on a series of 150 × 150 × 4 mm plates, which are made of PA6 based composite, containing different loadings varying from 40 - 50 wt% of the above carbon networks. Testing set-up was based on IEEE299 standard, employed with two horn antennas to determine the shielding effectiveness in the frequency window of 1 GHz - 14 GHz. For lower frequency testing, 10 MHz - 1 GHz, has been carried out based on a TEM-t cell.

For both the IEEE299 and TEM-t testing, the following protocol was used:
1. the testing material was placed in the middle of a radiator and a signal detector,
2. The radiator allowed to emit a polarized wave under a well-controlled manner,
3. The signal detector was placed in a well isolated space, surrounded with radiation absorber.
4. Radiation absorbed by the testing material attenuated during transmitting, and the penetrated radiation was detected by the signal detector.
5. The absorber ensured that any leaked radiation was vanished, thus avoiding to interfere the signal detection.

For the set-up based on IEEE299, there were two horn antennas installed at a distance of 62 cm. The detecting antenna was placed in a metal house (ca. 2 × 2 × 2 m), and the testing material was made into uniform plates and mounted on the metal house, where a hole had been made for mounting the testing materials. For the TEM-t set up, use was made of a portable device; both the signal emitter and detector were built in a metal housing, and the testing plate was inserted between the emitter and detector for conducting the measurements.

The results for X7-P are plotted in FIG. 2, and all results are summarized in table 1 below. The shielding effectiveness is described as the range formed from the upper and lower limits of the shielding capability. Summarizing, at these loadings, the carbon networks were found to result in a SE performance of 20 - 70 dB when used at thicknesses of 4 mm. The L(ongitudinal)-direction indicates that the plane of the wave radiation is parallel to the injection direction, and the T(ransversal)-direction indicates that the plane of the wave radiation is vertical to the injection direction.

TABLE 1 summary of the shielding effectiveness values in the frequency range of 10 MHz - 14 GHz

| Grade | loading (wt%) | Shielding effectiveness (dB) |
|---|---|---|
| XR-1 | 40 | 20-35 |
| XR-1 | 45 | 25-70 |
| X7-P | 45 | 25-65 |

Volume Resistivity

The measurements were performed with a Model 6487 Picoammeter_Voltage (Keithley). The volume conductivity was measured on IM impact bars. The 4*10 mm sections of the specimens were painted with silver paint. The results presented in table 2 below are based on measurements performed on 5 different bars.

TABLE 2

Summary of the volume resistivity values

| Grade | loading (wt%) | Volume resistivity (ohm.cm) |
|---|---|---|
| XR-1 | 30 | 50 |
| XR-1 | 35 | 10 |
| XR-1 | 40 | 7 |
| XR-1 | 45 | 2.5 |
| X7-P | 35 | 45 |

TABLE 2-continued

Summary of the volume resistivity values

| Grade | loading (wt%) | Volume resistivity (ohm.cm) |
|---|---|---|
| X7-P | 40 | 9 |
| X7-P | 45 | 3 |
| X7-P | 50 | 1 |

All the composites with carbon networks according to the invention exhibited electrical conductivity, i.e. volume resistivity was below $10^3$ ohm.cm. It shows the desired electrical conductivity can be provided by optimizing the conditions.

Surface Resistivity

Since in the art orientation of the fillers often leads to different shielding in longitudinal and transversal directions, both directions were studied. When a product has been made via injection moulding, the flow direction is defined as the longitudinal direction (L-direction) and vertical to the flow direction is the transversal direction (T-direction). For traditional materials, surface resistivity values measured along the L-direction and T-direction are often differing with multiple orders of magnitude.

The results for X7-P and XR-1 surface resistivity measured in L-direction and T-direction are plotted in table 3.

TABLE 3

Summary of the lateral and transversal surface resistivity for PA6 composites with variation in carbon network loading

| Grade | Mass fraction % | EC-SR-L (ohm/sq.) | EC-SR-T (ohm/sq.) |
|---|---|---|---|
| XR-1 | 40 | 5.5E+02 | 4.2E+02 |
| XR-1 | 45 | 2.6E+01 | 2.9E+01 |
| X7-P | 45 | 1.3E+01 | 1.5E+01 |

In accordance with the results shown in table 3, polymeric compounds containing the carbon networks of the invention in variable loadings showed a stable and uniform decrease in surface resistivity, even when the mass fraction was increased.

Orientation

Since the radiation generated for the EMI shielding measurement was polarized, it allowed for assessing whether the EMI shielding properties of the carbon networks was limited by the testing direction. For example, it could shield the radiation effectively when the testing plate is mounted to the wall straight, but lose shielding effectiveness when it was flapped with 90°. This is a well-known orientation issue for polymeric compounds, familiar issue when loaded with carbon nanotube (CNT), carbon fibres (CF), glass fibres (GF), etc for fillers.

Figure 2:
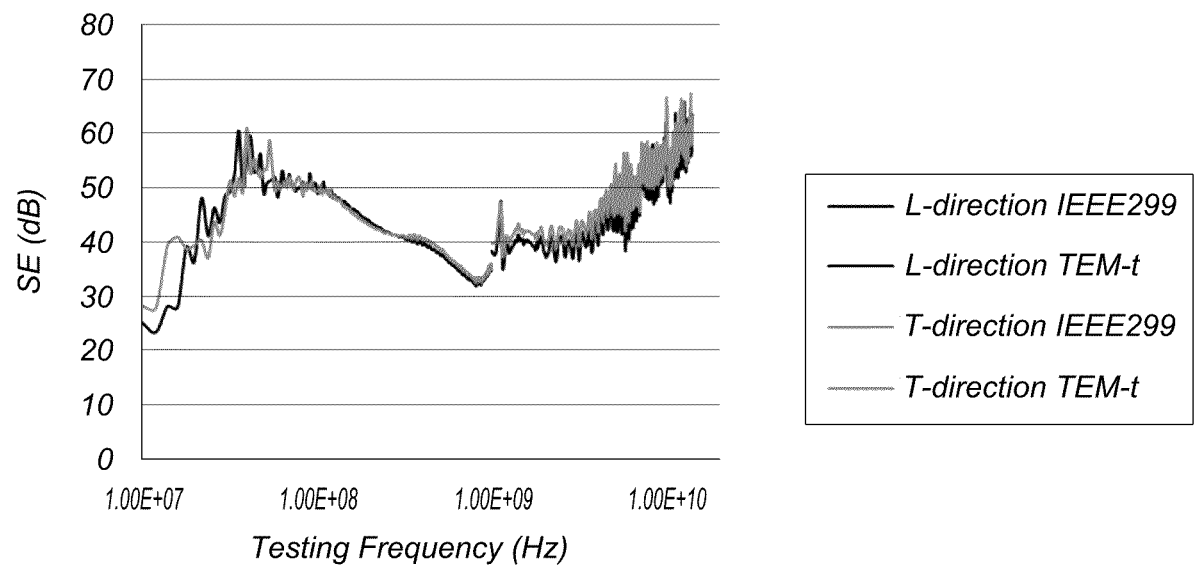
FIG. 2. Shielding effectiveness measurements for a 4 mm thick plate made from a PA6-based composite, with 45%wt of the carbon networks of the invention. Shielding effectiveness was shown in the frequency window of 10 MHz-14 GHz. The L(ongitudinal)-direction indicates that the plane of the wave radiation is parallel to the injection direction, and the T(ransversal)-direction indicates that the plane of the wave radiation is vertical to the injection direction.
Figure 3:
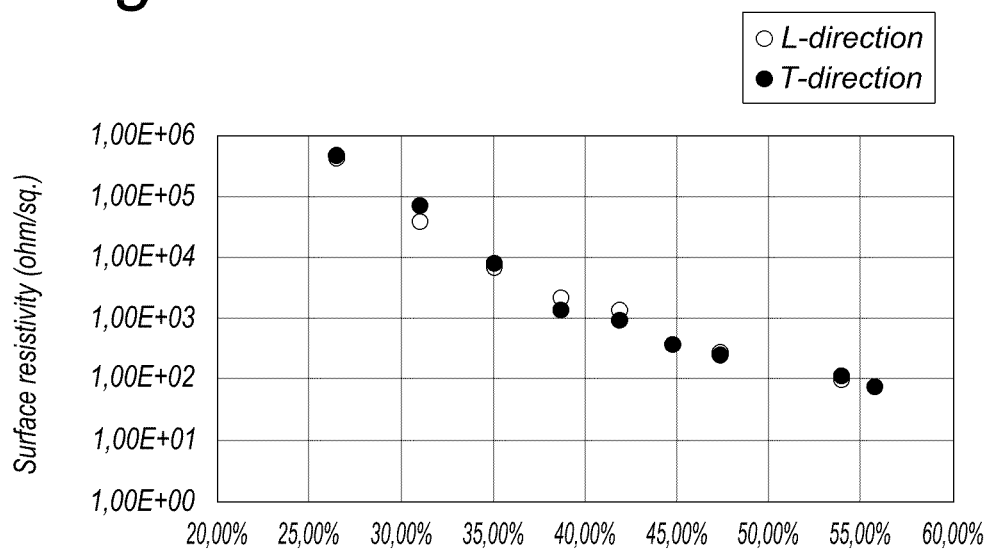
FIG. 3. Percolation curve based on surface resistivity measured from plates made of compounds containing carbon network composites in various mass fraction.

As evidenced in FIG. 2, the carbon networks did not suffer from the orientation problem. The compounds containing 45% Carbon networks show identical shielding effectiveness either in the 0° position and the 90° position (FIG. 2).

Shear Sensitivity

Shear is unavoidable during the polymer manufacturing process, which is resent in compounding, extruding, mixing, injection moulding, 3D printing, diluting, etc. Fillers are subject to shear in the abovementioned processes, and the ideal structure of the filler can potentially break, re-agglomerate and collapse, leading to loss of product functionalities.

Aiming at determining the shear sensitivity of the carbon network composites tested here above, the X7-P grade was processed with the PA6 at different shear levels, quantified in process pressure, and the properties have been summarized and shown below. The amounts of X7-P that was used in the composite for this purpose was 45%wt.

Each compound was processed in a twin-screw extruder under different process pressure, during which X7-P was incorporated into the polymeric matrix. Afterwards, the compounds were converted into ISO standard specimens via injection moulding machine, under the same but optimized conditions. Reference is made to ISO527 1A.

TABLE 4

Summary of the performance data of the compounds, which contain the same mass fraction (45%wt) of carbon networks but mixed into the PA6 at different pressure conditions.

| Processing pressure [bar] | E-mod [MPa] | Stress at yield [MPa] | Strain at yield [%] | Stress at break [MPa] | Strain at break [%] | Volume Resistivity [ohm.cm] | Degradation temperature [°C] |
|---|---|---|---|---|---|---|---|
| 10 | 4050.26 | 65.50 | 2.97 | 65.50 | 2.97 | 3.18E+00 | 461.59 |
| 29 | 4417.96 | 66.78 | 3.70 | 65.38 | 4.09 | 3.02E+00 | 461.34 |
| 47 | 4205.63 | 66.09 | 3.33 | 65.95 | 3.50 | 2.81E+00 | 459.77 |
| 51 | 4189.57 | 66.81 | 3.57 | 66.48 | 3.65 | 3.42E+00 | 462.66 |
| 52 | 4149.02 | 66.02 | 3.48 | 65.62 | 3.77 | 3.11E+00 | 460.81 |

In columns #2, #3 and #7, the E-modulus, tensile strength and volume resistivity are reported for different process pressures (an increase in process pressure corresponds to an increase in shear). The composites made from the carbon network fillers showed similar E-modulus and tensile strength regardless the composite manufacturing conditions. The same for the volume resistivity.

Viscosity

Adding filler ingredients into any polymeric matrix will lead to an increase of viscosity to the compound. As the viscosity of a compound becomes too high, the common processing, forming, or finishing techniques, such as injection moulding, film extrusion, blown film, 3D printing, fibre spinning, etc., will not be able to handle such compound anymore. The reasons can be due to motor limitation, down-stream processing constraints, product defects, etc.

The carbon networks were found processable even at 50 wt% loading here above. No viscosity issues were reported to get to those levels. Viscosity can be evaluated in terms of melt flow rate. In this example the melt flow rate of different compounds containing carbon networks [X7-P] and a conductive carbon black Vulcan XC72 (Cabot Corporation) [CB] was measured. The melt flow rate is the rate of extrusion of a molten thermoplastic through a die, with a piston, both positioned in a chamber of specified lengths and diameters, defined by ISO 1133-1. The extrusion is made under prescribed conditions of temperature and load, based on the thermoplastic nature. The rate is determined as the mass extruded over a specified time.

The pellets of PA6 were dried before MFR measurements at 80° C. with a moisture analyzer. The temperature of the chamber was set at 235 C. The selected load was first 2.16 kg. If MFR value obtained with 2.16 kg was below 2 g/10 min, the load was then increased to 5 kg. If MFR value obtained with 5 kg was below 2 g/10 min, the load was then increased to 10 kg.

|  | Avg load [%] | MFR @ 10 kg [g/10min] | Emod (Mpa) | Tensile (Mpa) | Impact (kJ/m2) |
| --- | --- | --- | --- | --- | --- |
| CB | 32 | 0.2 | 3061.8 | 63.3 | 6.6 |
|  | 36 | 0.1 | 3384.4 | 58.5 | 3.8 |
| X7-P | 35 | 12.3 | 3478.5 | 63.9 | 8.1 |
|  | 40 | 3.8 | 3911.0 | 65.1 | 6.4 |
|  | 44 | 1.1 | 4260.0 | 67.1 | 4.3 |

|  | Avg load [%] | MFR @ 10 kg [g/10 min] | VR (Ohm.cm) |
| --- | --- | --- | --- |
| CB | 32 | 0.16 | 4.8E+00 |
|  | 36 | 0.08 | 1.6E+00 |
| X7-P | 35 | 12.35 | 4.5E+01 |
|  | 40 | 3.83 | 9.3E+00 |
|  | 44 | 1.11 | 3.1E+00 |

At same level of properties, the composites comprising carbon networks of the invention exhibited a higher MFR, therefore lower viscosity than carbon black.

Example 2 Highly Conductive Elastomers for EMI Shielding Applications.

The composites were produced according to the ASTM D3191 and D3192. The mixing procedures can be referred to ASTM D 3191 and 3192. In general, the mixing of rubber compounds was first carried out in a 1.6 liter Banbury type internal mixer, at starting conditions of 75 rpm, 50° C. and a load factor of 70%. In the first step, raw rubber was introduced into the internal mixer and mixed for 1 minute. In the second step, a mixture containing half portion of Carbon networks, ZnO and steric acid, was loaded into the internal mixer and mixed for 1.5 minute. In the third step, the leftover carbon networks were added into the internal mixer and mixed for 1.5 minute. In the fourth step, the ram was lifted and all the non-mixed ingredients swept into the internal mixer, and mixing continued for another minute. After a total operating time of 5 minutes, the internal mixer was opened and the composite collected. The optimal temperature of the compound was below 160° C., to avoid degradation.

Incorporation of curative and accelerators was carried out by using a 2-roll mill, with a roller temperature of 50° C. The compound prepared in the internal mixer was first flattened by the 2-roll mill, and then the curative and accelerators were added.

| Matrix | CarbonX grade | Loading [phr] | Surface Resistivity [ohm/sq] | Volume Resistivity [ohm.cm] |
| --- | --- | --- | --- | --- |
| NR | XR-1 | 50 | 3.55E+02 | n.a. |
| NR | XR-1 | 70 | 1.48E+02 | n.a. |
| NR | XR-1 | 90 | 6.95E+01 | n.a. |
| FKM | XR-1 | 20 | n.a. | 6.00E+00 |
| NBR | XR-1 | 60 | n.a. | 1.20E+02 |

Example 3: Comparison Between Carbon Networks According to the Invention and CVD-Produced Networks According to US2013/244023

Networks are produced with the same emulsion composition, but with the production settings of a CVD process as described in US 2013/244023, and with the production settings of a furnace black process.

In both cases, the emulsion composition is as described in the experimental parts of WO2018/002137:
a) Carbon Black slurry oil (CBO or CBFS oil)
b) Water phase containing 3500 mM metal precursor salt (FeCl2)
c) Water phase containing reducing agent (3650 mM citric acid)
d) Surfactant (TritonX; HLB 13.4).

In each case, the emulsions were introduced in the middle of a quartz-tube of a thermal horizontal tube reactor.

The CVD reactor was heated up to 750° C. (3 K/min) under 130 seem of nitrogen flow and kept for 90 min at the same temperature. In the first 60 min the nitrogen gas flow was reduced to 100 sccm and ethylene gas was added at 100 sccm flow. During the last 30 minutes at 750° C. the ethylene was purged out from nitrogen at 130 sccm for the last 30 min and the reactor was then cooled down.

Fiber length > 300 nm
Diameter: 50 -250 nm

For the furnace black process, N110 settings were applied:

| Based on | Feedstock flowrate [t/h] | CH4 rate [Nm3/h] | Combustion Air rate [Nm3/h] | Combustion air temp [C] | Residence time + [ms] |
| --- | --- | --- | --- | --- | --- |
| N110 | 2 | 485 | 7000 | 620 | 22 |

Fiber length: 30-300 nm
Diameter: 10-50 nm

In both cases, networks were formed. However, the 'CVD-produced' carbon networks yielded high conductivity and reinforcement (see graph 9a and 9b in US2013/244023) at low loadings < 5%wt. These results are obtained with PI and PMMA. Those can be compared to the performance of the carbon networks as described in WO2018/002137: From the results plotted for PA6 there, it can be derived that loadings of 5-10 wt% were needed to achieve the same high stiffness and conductivity.

The invention claimed is:

1. A method for electromagnetic interference (EMI) shielding by providing an assembly with porous, covalently bonded, crystalline carbon-nanofibres comprising carbon networks, wherein the carbon networks are intraparticle porous networks wherein the carbon nanofibers are interconnected to other carbon nanofibers in the networks by covalent bonds via junctions, wherein the pores in the networks have an intraparticle pore diameter size of 5-150 nm using Mercury Intrusion Porosimetry according to ASTM D4404-10, wherein at least 20 wt% of the carbon in the carbon networks is in crystalline form, and the carbon nanofibers have an average aspect ratio of fibre length-to-thickness of at least 2.

2. The method according to claim 1, for EMI shielding in the frequency of 10 MHz - 40 GHz.

3. The method according to claim 1, wherein the networks are incorporated in a thermoplastic, elastomeric and/or thermoset polymer matrix in an EMI shielding assembly, to obtain an assembly having a shielding effectiveness of at least 20 dB at frequencies between 10 MHz and 40 GHz according to IEEE299 on the outer surface of the assembly.

4. The method according to claim 3, wherein the networks are incorporated in a thermoplastic, elastomeric and/or thermoset polymer matrix in an EMI shielding assembly, to obtain an assembly having a shielding effectiveness of 40 - 100 dB at frequencies between 10 MHz and 40 GHz according to IEEE299 on the outer surface of the assembly.

5. The method according to claim 1, wherein the assembly comprises at least 15 wt% of porous, covalently bonded, crystalline carbon-nanofibres comprising carbon networks based on the total assembly weight.

6. The method according to claim 1, wherein the assembly comprises porous, covalently bonded, crystalline carbon-nanofibres comprising carbon networks together with one or more EMI shielding agents selected from carbon nanotubes (CNT), carbon fibres (CF), glass fibres (GF), steel fibres (SF) and porous, covalently bonded, crystalline carbon-nanofibres comprising carbon networks, wherein at least 15 wt% of the sum of all shielding agent(s), the number based on the weight of the assembly, and wherein the amount of porous, covalently bonded, crystalline carbon-nanofibres comprising carbon networks is at least 1 wt% of the assembly.

7. The method according to claim 1, wherein the assembly is a housing assembly for an electric vehicle, a seal for an electrical vehicle, a battery casing for an energy source, radar shield or medical diagnostic shield.

8. The method according to claim 1, wherein the assembly has a volume resistivity of 0.01 - 1000 ohm.cm.

9. The method according to claim 1, wherein the tensile strength of the assembly is maintained or improved at a tensile strength value of 100 – 200% compared to the tensile strength of the corresponding assembly without the networks; and/or wherein the assembly has a stiffness which is 10%-300% higher than the stiffness for the corresponding assembly without the networks.

10. A EMI shielding composite assembly comprising a thermoplastic, elastomeric and/or thermoset polymer matrix and at least 15 wt% of porous, covalently bonded, crystalline carbon-nanofibres comprising carbon networks based on the total assembly weight, wherein the carbon networks are intraparticle porous networks wherein the carbon nanofibers are interconnected to other carbon nanofibers in the networks by covalent bonds via junctions, wherein the pores in the networks have an intraparticle pore diameter size of 5-150 nm using Mercury Intrusion Porosimetry according to ASTM D4404-10, wherein at least 20 wt% of the carbon in the carbon networks is in crystalline form, and the carbon nanofibers have an average aspect ratio of fibre length-to-thickness of at least 2,
the assembly having an electromagnetic shielding effectiveness of at least 20 dB at frequencies between 10 MHz and 40 GHz according to IEEE299 on the outer surface of the assembly.

11. A EMI shielding composite assembly comprising a thermoplastic, elastomeric and/or thermoset polymer matrix and one or more EMI shielding agents selected from carbon nanotubes (CNT), carbon fibres (CF), glass fibres (GF), steel fibres (SF) and porous, covalently bonded, crystalline carbon-nanofibres comprising carbon networks, wherein at least 15 wt% of the sum of all shielding agent(s), the number based on the weight of the assembly, and wherein the amount of porous, covalently bonded, crystalline carbon-nanofibres comprising carbon networks is at least 1 wt% of the assembly, wherein the carbon networks are intraparticle porous networks wherein the carbon nanofibers are interconnected to other carbon nanofibers in the networks by covalent bonds via junctions, wherein the pores in the networks have an intraparticle pore diameter size of 5-150 nm using Mercury Intrusion Porosimetry according to ASTM D4404-10, wherein at least 20 wt% of the carbon in the carbon networks is in crystalline form, and the carbon nanofibers have an average aspect ratio of fibre length-to-thickness of at least 2,
the assembly having an electromagnetic shielding effectiveness of at least 20 dB at frequencies between 10 MHz and 40 GHz according to IEEE299 on the outer surface of the assembly.

12. The assembly according to claim 10, having a volume resistivity of 0.01 – 1000 ohm.cm.

13. The assembly according to claim 11, wherein the assembly is for the automotive industry, telephone carrier applications, defence application, sensing devices, and medical industry.

14. The assembly according to claim 11, wherein the assembly is a housing assembly for an electric vehicle, a seal for an electrical vehicle, a battery casing for an energy source, radar shield, medical diagnostic shield.

15. The assembly according to claim 10, wherein the assembly is a housing assembly for an electric vehicle, a seal for an electrical vehicle, a battery casing for an energy source, radar shield, medical diagnostic shield.

16. The assembly according to claim 11, wherein the tensile strength is maintained or improved, at a tensile strength value of 100 – 200% compared to the tensile strength of the corresponding assembly without the networks; and/or wherein the assembly has a stiffness which is 10%-300% higher than the stiffness for the corresponding assembly without the networks.

17. The method according to claim 1, wherein the networks are obtainable by a process for the production of crystalline carbon networks in a reactor which contains a reaction zone and a termination zone, by injecting a water-in-oil or bicontinuous micro-emulsion, said micro-emulsion comprising metal catalyst nanoparticles, into the reaction zone which is at a temperature of above 600° C., to produce crystalline carbon networks, transferring these networks to the termination zone, and quenching or stopping the formation of crystalline carbon networks in the termination zone by spraying in water.

18. The method according to claim 17, wherein the reactor is a furnace carbon black reactor which contains, along the axis of the reactor, a combustion zone, a reaction zone and a termination zone, wherein the process for the production of crystalline carbon networks involves producing a stream of hot waste gas in the combustion zone by burning a fuel in an oxygen-containing gas and passing the waste gas from the combustion zone into the reaction zone, spraying a water-in-oil or bicontinuous micro-emulsion, said micro-emulsion comprising metal catalyst nanoparticles, in the reaction zone containing the hot waste gas, carbonizing said emulsion at a temperature of above 600° C., and quenching or stopping the reaction in the termination zone by spraying in water, to yield crystalline carbon networks.

19. The assembly according to claim 10, wherein the networks are obtainable by a process for the production of crystalline carbon networks in a reactor which contains a reaction zone and a termination zone, by injecting a water-in-oil or bicontinuous micro-emulsion, said micro-emulsion comprising metal catalyst nanoparticles, into the reaction zone which is at a temperature of above 600° C., to produce crystalline carbon networks, transferring these networks to the termination zone, and quenching or stopping the formation of crystalline carbon networks in the termination zone by spraying in water.

20. The assembly according to claim 11, wherein the networks are obtainable by a process for the production of crystalline carbon networks in a reactor which contains a reaction zone and a termination zone, by injecting a water-in-oil or bicontinuous micro-emulsion, said micro-emulsion comprising metal catalyst nanoparticles, into the reaction zone which is at a temperature of above 600° C., to produce crystalline carbon networks, transferring these networks to the termination zone, and quenching or stopping the formation of crystalline carbon networks in the termination zone by spraying in water.

* * * * *